United States Patent
Hackl

(10) Patent No.: US 9,134,345 B2
(45) Date of Patent: Sep. 15, 2015

(54) METHOD AND DEVICE FOR AC/DC SENSITIVE CURRENT MEASUREMENT

(71) Applicant: Bender GmbH & Co. KG, Gruenberg (DE)

(72) Inventor: Dieter Hackl, Fernwald (DE)

(73) Assignee: BENDER GMBH & CO. KG, Gruenberg (DE)

( * ) Notice: Subject to any disclaimer, the term of this patent is extended or adjusted under 35 U.S.C. 154(b) by 243 days.

(21) Appl. No.: 13/914,219

(22) Filed: Jun. 10, 2013

(65) Prior Publication Data

US 2013/0328548 A1    Dec. 12, 2013

(30) Foreign Application Priority Data

Jun. 12, 2012 (DE) .......................... 10 2012 209 782

(51) Int. Cl.
| | |
|---|---|
| *G01R 15/18* | (2006.01) |
| *G01R 1/22* | (2006.01) |
| *G01R 19/20* | (2006.01) |

(52) U.S. Cl.
CPC ................ *G01R 1/22* (2013.01); *G01R 15/185* (2013.01); *G01R 19/20* (2013.01)

(58) Field of Classification Search
CPC ........ G01R 15/185; G01R 19/20; G01R 1/22; G01R 33/02; G01R 33/04; G01R 33/1223; G01R 33/383
See application file for complete search history.

(56) References Cited

U.S. PATENT DOCUMENTS

| | | | | |
|---|---|---|---|---|
| 4,280,162 | A * | 7/1981 | Tanka et al. ..................... | 361/45 |
| 2007/0052432 | A1* | 3/2007 | Machida et al. .............. | 324/754 |
| 2007/0126443 | A1* | 6/2007 | Grube et al. .................. | 324/754 |

FOREIGN PATENT DOCUMENTS

| | | |
|---|---|---|
| CH | 270675 A | 9/1950 |
| DE | 69334074 T2 | 3/2007 |
| EP | 0132745 A2 | 2/1985 |
| EP | 1542025 A1 | 6/2005 |
| FR | 2586817 A1 | 3/1987 |
| GB | 2000873 A | 1/1979 |
| JP | H0529167 A | 2/1993 |

OTHER PUBLICATIONS

European Patent Office, Search Report, EP 13 16 9652, Sep. 13, 2013, 3 pages.
State Intellectual Property Office of People's Republic of China, First Office Action and Search Report, Application No. 201310233360.1, Jun. 12, 2015, 10 pages.

* cited by examiner

*Primary Examiner* — Tung X Nguyen
(74) *Attorney, Agent, or Firm* — Quarles & Brady LLP

(57) ABSTRACT

A method and a device for galvanically isolated, AC/DC sensitive current measurement including a control current transformer having a temporally changeable magnetic control flux which is not coupled to the magnetic flux in a measuring current transformer and forms a magnetic circuit in such a manner that a segment of the magnetic circuit of the measuring current transformer is formed as a shared segment with the magnetic circuit of the control current transformer so that the material forming the shared segment is permeated by the control flux and in connection with a nonlinear magnetic characteristic curve causes a change of the relative permeability in the material forming the segment and thus an induced partial voltage in the secondary winding.

19 Claims, 2 Drawing Sheets

METHOD AND DEVICE FOR AC/DC SENSITIVE CURRENT MEASUREMENT

CROSS REFERENCE TO RELATED APPLICATION

This application claims the priority benefit of German Patent Application No. 10 2012 209 782.1 filed on Jun. 12, 2012, which is fully incorporated herein by reference.

STATEMENT REGARDING FEDERALLY SPONSORED RESEARCH OR DEVELOPMENT

Not applicable.

FIELD OF THE INVENTION

The invention relates to a method and a device for galvanically isolated, AC/DC sensitive current measurement, comprising a measuring current transformer having a primary winding through which a current to be measured is flowing, a transformer coupling between the primary winding and a secondary winding via a shared magnetic flux which forms a magnetic circuit having at least one segment made from a material of a relative permeability, wherein in the secondary winding a first partial voltage proportional to the change in time of the primary-side current is induced.

BACKGROUND OF THE INVENTION

Methods and devices for galvanically isolated current measurement are known in the function and form of differential current monitoring devices for electric systems. According to VDE (Association for Electrical, Electronic and Information Technologies e.V.) regulations, it is the task of a differential current monitoring device to monitor electrical installations or circuits for the occurrence of a differential current and to report it by an alert if the differential current exceeds a predefined value. For this purpose, all active conductors of the cable outlet to be protected are guided as a primary winding through a measuring current transformer having a secondary winding. The measuring current transformer constitutes a magnetic circuit in which the magnetic field generated by the current flowing in the primary winding is guided and thus transformer-coupled to the secondary winding via a shared magnetic flux. The closed magnetic circuit can be composed of several segments of varying permeability, for example of a magnet core material of high permeability and an air gap, which always has the relative permeability $\mu_{rel}=1$.

In a power supply system without faults, the vectorial sum of all currents, and thus the differential current, equal zero so that no voltage is induced in the secondary winding. If, however, a fault current is flowing off to earth, e.g. as a result of an insulation fault, then a differential current flows through the measuring current transformer, whose magnetic circuit, in the case of a change in time, induces a voltage on the secondary side, which can be detected and evaluated. Due to the induction principle, such an arrangement is only capable of detecting changes in time in the magnetic flux and thus only primary-side current changes causing these flux changes.

However, consumers connected to the electric system, such as electric machines which have electronic semiconductor components like diodes or thyristors in rectifiers or frequency inverters, can also cause differential currents which do not have a purely sinus-shaped temporal progression, but a pulsing one or which occur as a direct differential current. Therefore, an AC/DC sensitive current measurement should be sought for these fields of application.

From the state of the art, methods for AC/DC sensitive measurement are known which work based on the principle of magnetic compensation. Therein, two secondary windings are arranged on the current transformer core, the measuring current transformer being integrated in a push-pull oscillator as an element generating oscillations. Due to the oscillator principle, the oscillating frequency is permanently flowing through the magnetic characteristic curve of the core up to the saturation range. Thereby, direct current magnetizations are compensated, wherein the compensation current flowing through the oscillator is proportionally influenced by the alternating differential current and the direct differential current and can be evaluated. It proves disadvantageous in this method that the magnetically soft core material has to meet high requirements due to the operation of the oscillator. Additionally, especially in larger measuring current transformers, only low bandwidths can be achieved with regard to the alternating differential currents to be registered.

Other methods for AC/DC sensitive current measurement are based on compensation circuits in connection with the use of magnetic field sensors, such as Hall probes, magnetoresistive sensors, or on flux gate magnetometers. Such arrangements oftentimes only have a narrow dynamic range.

Finally, there are methods for measuring currents using shunt resistors, wherein the galvanic isolation is effected by isolation amplifiers and an evaluation of the measured values takes place by means of digital signal processing. However, the registration via shunt resistances in connection with a separate galvanic isolation can prove to be a costly solution, in particular in the case of higher supply voltages in the network to be monitored.

SUMMARY OF THE INVENTION

Therefore, it is the object of the present invention to develop a method and a device for AC/DC sensitive current measurement, which, in particular for the measurement of temporally constant primary-side currents (direct differential currents), have a high measuring sensitivity as well as a wide dynamic range. The method and the device must be equally suitable for an application in current supply systems for differential current measurement as well as for an application for simple current measurement.

This object is attained with regard to a method in that, by a change in time of the relative permeability in the material forming the segment, a second partial voltage is induced in the secondary winding which is directly proportional to a direct current to be measured in the primary winding.

In addition to the first partial voltage induced due to the change in time of the primary current, in the case of a direct current portion flowing in the primary winding, a second partial voltage is induced which is directly proportional to this direct current portion as a cause of the temporally changing relative permeability.

The first induced partial voltage arises in a known manner according to the law of induction from the change in time of the primary current i:

$$u_{i1}(t) = NA_{\mathit{eff}} \frac{\partial B_m}{\partial t} = NA_{\mathit{eff}} N \frac{\mu_{rel}\mu_0}{l_{\mathit{eff}}} \frac{\partial i}{\partial t} \quad (1)$$

with

-continued $$\frac{\partial B_m}{\partial t} = \frac{N\mu_{rel}\mu_0}{l_{eff}} \frac{\partial i}{\partial t},$$

with N=number of windings, $\mu_{rel}$=relative permeability (permeability number), $\mu_0$=4π10$^{-7}$ Vs/Am (magnetic constant), $A_{eff}$=effective magnetic cross-section, $l_{eff}$=effective magnetic path length.

A temporally constant primary current—meaning a direct differential current or direct current flowing through the measuring current transformer on the primary side—does not cause an induction voltage. The mechanism of action according to equation (1) therefore is only suitable for registering alternating values.

According to the invention, the claimed method for AC/DC sensitive current measurement thus comprises a second mechanism of action, which is based on the change in time of the relative permeability in the material forming the segment and which causes a second induced partial voltage whose amplitude is directly proportional to a direct current to be measured in the primary winding.

$$u_{i2}(t) = NA_{eff}\frac{\partial B_m}{\partial t} = NA_{eff}N\Delta I_{DC}\frac{\mu_0}{l_{eff}}\frac{\partial \mu_{rel}}{\partial t} \qquad (2)$$

mit $$\frac{\partial B_m}{\partial t} = N\Delta I_{DC}\frac{\mu_0}{l_{eff}}\frac{\partial \mu_{rel}}{\partial t},$$

wherein $\Delta I_{DC}$ describes the direct current (primary current) to be measured.

It can be taken from equation (2) that also a temporally constant primary current can be detected from the occurrence of an induction voltage if the relative permeability of the magnet material changes temporally.

In a further preferred embodiment, the change in time of the relative permeability is effected in the material forming the segment by means of a control current transformer which generates a magnetic control flux in the material forming the segment which is not coupled to the magnetic flux of the measuring current transformer.

In order to be able to influence the relative permeability of the material, the latter is permeated by a magnetic control flux which is independent from the magnetic flux coupling the primary and secondary winding of the measuring current transformer. The control flux is generated and guided by a control current transformer in such a manner that no coupling occurs between the magnetic circuit of the measuring current transformer and the control flux. In the practical implementation of the method, this can be achieved in that the induction lines in the measuring current transformer and the induction lines forming the control flux run orthogonally to each other in an intersecting segment.

Advantageously, the magnetic control flux is generated in the control current transformer by a control winding through which a temporally changeable control current with an adjustable frequency is flowing.

The magnetic field necessary for changing the relative permeability can be generated in a simple manner by a (control) current winding and be guided through the intersecting segment by a control transformer magnet core. The change in time of the control flux takes place in that the control current forms an alternating current of adjustable frequency. Since the magnetic flux in the measuring current transformer and the magnetic flux in the control current transformer are electromagnetically decoupled (the magnetic induction lines in the shared segment run orthogonally to each other), there is no transformer coupling between the control winding and the secondary winding of the measuring current transformer (measuring winding).

In an advantageous manner, the temporally changeable control current in connection with a nonlinear magnetic characteristic curve causes a modulation-dependent change of the relative permeability in the material forming the segment by changing the magnetic working point. Depending on the current through the control winding and the resulting magnetic field strength, the working point and thus the relative permeability of the material in the intersecting segment can be influenced via the induction occurring corresponding to the nonlinear magnetic characteristic curve. The applying formula is:

$$\mu_{rel}(t) = f(i_{st}(t)) \qquad (3),$$

wherein $i_{st}(t)$ is the time-dependent control current.

At a load resistance of the secondary winding of the measuring current transformer, a sum measuring voltage can be registered due to the superimposing first and second induced partial voltages. In a closed secondary circuit of the measuring current transformer, the induced partial voltages cause a current flow which leads to a voltage drop at the load resistance, which can be tapped in a superimposed state as a sum measuring voltage.

The registered sum measuring voltage is assessed synchronously to the temporally changeable control current.

The assessment of the registered sum measuring voltage is effected by means of a voltage which is synchronous to the temporally changeable control current and by which the sum measuring voltage registered at the load resistance is multiplied, resulting in a second measuring signal proportional to the direct current to be measured.

This assessment corresponds to a synchronous rectifier circuit by means of which the portion of the sum measuring voltage caused by the second induced voltage is rectified. In this manner, a measuring signal proportional to the direct current is obtained.

Advantageously, a filtering of the registered sum measuring voltage is effected by means of a filter circuit, which is formed as a band rejection filter at the set frequency of the changeable control current and which results in a first measuring signal proportional to the alternating current to be measured.

In a signal path parallel to the synchronous rectifier, a filtering of the registered sum measuring voltage takes place. The filter circuit blocks interfering signal portions in the sum measuring voltage, which occur due to the second induced voltage, so that on the filter output a first measuring signal is generated, which is to be traced back exclusively to the first induced voltage and thus represents a measuring signal proportional to the alternating differential current to be measured or to the alternating current to be measured, respectively.

Subsequently, the first measuring signal and the second measuring signal are added to obtain an output signal which displays the result of the AC/DC sensitive current measurement.

In a further advantageous embodiment, the frequency of the control current can be switched cyclically between at least two frequencies for a better registration of the first and second measuring signal.

This measure makes it possible that, given the case in which the frequency of the control current (for generating the second measuring signal) and the frequency of the transformer-transmitted signal (first measuring signal) are close and the measuring signals might interfere with each other, the measuring signals can be distinguished more clearly by cyclically switching the frequency of the control current because due to the frequency change the second measuring signal representing the direct differential current changes in a jumping manner and synchronously to the frequency change.

The object on which the invention is based is further attained with regard to a device for galvanically isolated, AC/DC sensitive current measurement, comprising a measuring current transformer having a primary winding through which a current to be measured is flowing, a transformer coupling between the primary winding and a secondary winding via a shared magnetic flux which forms a magnetic circuit having at least one segment made from a material of relative permeability, wherein in the secondary winding a first partial voltage proportional to the change in time of the primary-side current is induced by a control current transformer having a temporally changeable magnetic control flux which is not coupled to the magnetic flux in the measuring current transformer and forms a magnetic circuit in such a manner that the segment of the magnetic circuit of the measuring current transformer is formed as a shared segment with the magnetic circuit of the control current transformer so that the material forming the shared segment is permeated by the control flux and causes in connection with a nonlinear magnetic characteristic curve a change of the relative permeability in the material forming the segment and thus a second induced partial voltage in the secondary winding.

Corresponding to the features of the claimed method, the device according to the invention therefore comprises a control current transformer which generates a temporally changeable control flux which is independent from the magnetic flux in the measuring current transformer. For this purpose, the closed induction lines of this control flux form a magnetic circuit which is arranged in relation to the position of the measuring current transformer in such a manner that a segment of the magnetic circuit of the measuring current transformer is formed as a shared segment with the magnetic circuit of the control current transformer. In this manner, the shared segment is permeated by the magnetic flux generated in the measuring current transformer as well as by the magnetic flux generated in the control current transformer. The material forming the shared segment has a nonlinear magnetic characteristic curve so that by changing the magnetic working point along this characteristic curve, a modulation-dependent change of the relative permeability is caused and, according to the above-cited equation (2), thus a second partial voltage is induced in the secondary winding, which is directly proportional to a direct current to be measured in the primary winding.

In a further advantageous embodiment, for decoupling the magnetic flux in the measuring current transformer and the magnetic flux in the control current transformer, the measuring current transformer and the control current transformer are arranged such that the magnetic induction lines in the shared segment of the two magnetic circuits run orthogonally to each other.

The magnetic fluxes in the measuring current transformer and in the control current transformer are thus independent form each other so that the change of the magnetic working point and thus the change of the relative permeability do not have a distorting feedback on the magnetic flux in the measuring current transformer. Between the secondary winding of the measuring current transformer and a control winding (see below) disposed on the control current transformer, there is a transformer coupling due to the orthogonal magnetic induction courses.

Preferably, the connection between the measuring current transformer and the control current transformer is formed in the shared segment of the two magnetic circuits with or without an air gap.

An embodiment with an air gap has the advantage that the measuring current transformer can be produced with a conventional magnet core and the measuring current transformer and the control current transformer can be wound separately. An embodiment without an air gap, on the other hand, can be produced customer-specific with ferrite material and has the advantage that even with a low control performance, a large change of the relative permeability can be achieved.

The control current transformer has a control winding through which a temporally changeable control current is flowing with an adjustable frequency.

The control current generates a magnetic field so that a magnetic induction is passed according to the nonlinear magnetic characteristic curve. The change in time of the permeability in the material forming the shared segment is effected by a change of the magnetic working point, thus modulation-dependent according to the above-cited equation (3). Since, additionally, there is no coupling to a load resistance in the control current transformer (the control current transformer only comprises the control winding as the single winding), the required change of the relative permeability can be achieved with small changes of the control current.

In a further embodiment, the device comprises a signal processing means which for registering a sum measuring voltage has a load resistance in the secondary winding of the measuring current transformer.

On the load resistance, voltages can be tapped as superimposed measuring voltages and then be processed, which result from the first induced partial voltage and from the second induced partial voltage in the measuring current transformer.

The signal processing means comprises an assessment circuit for rating the registered sum measuring voltage.

Preferably, the assessment circuit therein comprises a voltage source which is controlled synchronously to the changeable control current and whose output voltage is supplied to a multiplier and multiplied by the registered sum measuring voltage.

To obtain a measuring signal (second measuring signal) proportional to the direct current to be measured, the portion of the sum measuring voltage caused by the second induced voltage is rated synchronously to the course of the control current (synchronous rectifier circuit).

Further, the signal processing means comprises a filter circuit, on the input of which the registered sum measuring voltage is applied and which is formed as a band rejection filter at the set frequency of the changeable control current.

The band rejection filter prevents interfering signal portions from passing through the signal path for determining the first measuring signal together with the frequency of the control current so as not to distort the measuring signal, which is proportional to the alternating current to be measured.

In a preferred embodiment, the control current transformer has a magnetic path length as short as possible. For the required change of the relative permeability, then only slight changes of the control current are necessary, which is particularly advantageous in very large measuring current transformers.

BRIEF DESCRIPTION OF THE DRAWINGS

Further advantageous realization features result from the following description and the drawings, which illustrate a preferred embodiment of the invention with examples.

DETAILED DESCRIPTION OF THE EXAMPLE EMBODIMENTS

Figure 1:
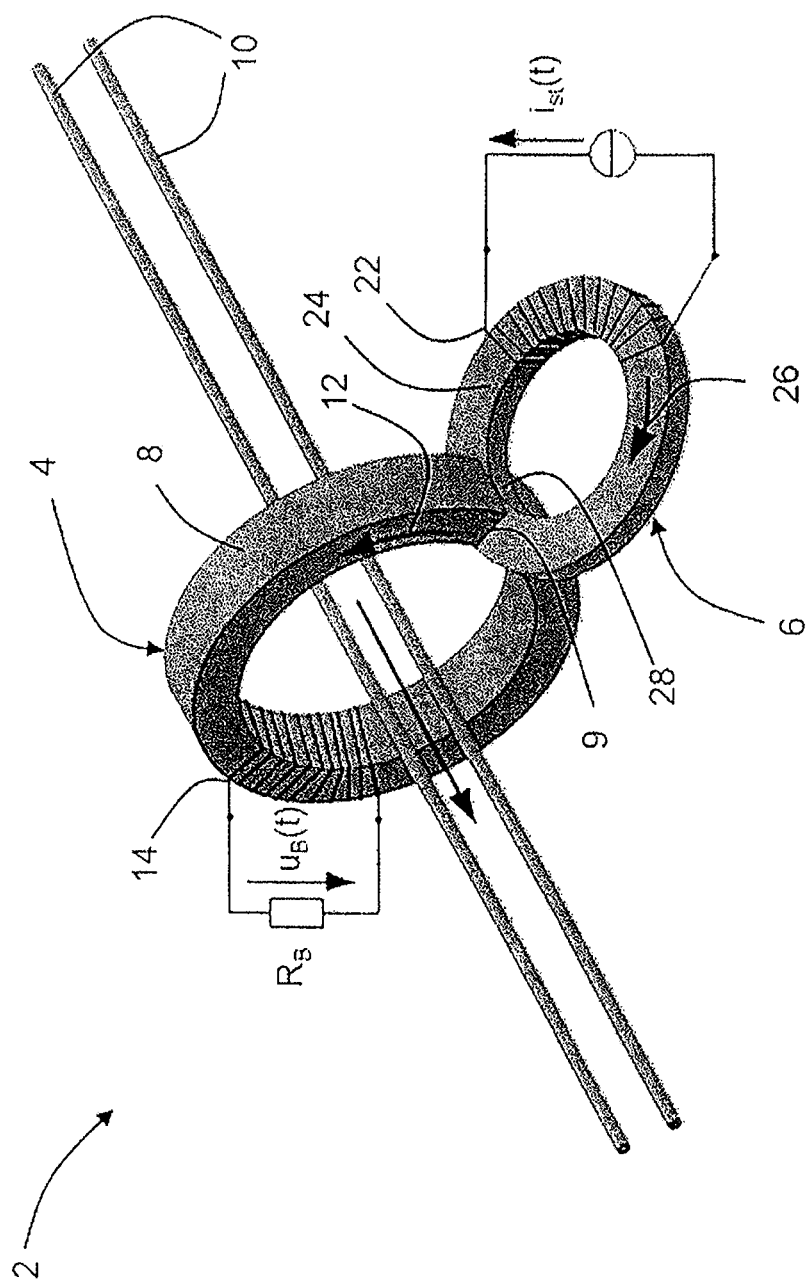
FIG. 1 shows a basic structure of device according to the invention.

FIG. 1 shows a basic structure of a device 2 according to the invention for galvanically isolated, AC/DC sensitive current measurement. The device 2 comprises a measuring current transformer 4 and a control current transformer 6. The measuring current transformer 4 comprises a conventional annular magnet core 8 with an air gap 9. Alternatively to the illustrated realization example, an embodiment of the magnet core 8 made of ferrite material without air gap 9 is possible as well. An electric lead 10 acting as a primary winding 10 with two active conductors is guided through the measuring current transformer 4. A secondary winding 14 is transformer-coupled to the primary winding 10 via a magnetic flux 12 in the magnet core 8. For measuring a (sum) measuring voltage $u_B(t)$ proportional to the induced voltages, the secondary winding 14 is closed by a load resistance $R_B$.

The control current transformer 6 comprises a control winding 22 through which a time-dependent control current $i_{st}(t)$ is flowing. The control current $i_{st}(t)$ generates a magnetic flux 26 in the closed annular core 24 of the control current transformer 6. Herein, the control current transformer 6 is arranged in such a manner that the annular core 24 of the control current transformer 6 is guided through the air gap 9 of the measuring current transformer 4 and intersects with the magnetic circuit of the measuring current transformer 4. Thus, the part of the control transformer annular core 24 positioned in the air gap 9 forms a shared segment 28 of the magnetic circuit of the measuring current transformer and the magnetic circuit of the control current transformer. The material of the shared segment 28 is permeated by both the magnetic flux 12 of the measuring current transformer 4 and the magnetic flux 26 of the control current transformer 6, wherein the respective induction lines run orthogonally to each other and thus there is no coupling between the magnetic fluxes 12, 26 occurring in the respective magnet cores 8, 24.

Due to the time-dependent control current $i_{st}(t)$, the magnetic working point of the material forming the shared segment 28 can now be changed, resulting in a change of the relative permeability $\mu_{rel}$, the change being modulation-dependent corresponding to the magnetic characteristic curve of the material. Thus, when a direct current is flowing in the lead 10, a measuring signal (second measuring signal 32, FIG. 2) proportional to this direct current can be registered at the load resistance $R_B$ according to the above-cited equation (2). A first measuring signal 31 (FIG. 2), which can be derived according to the above-cited equation (1) and occurs as a result of an alternating current to be measured, superimposes the second measuring signal 32 so that on the load resistance a sum-measuring signal $u_B(t)$ is available.

Figure 2:
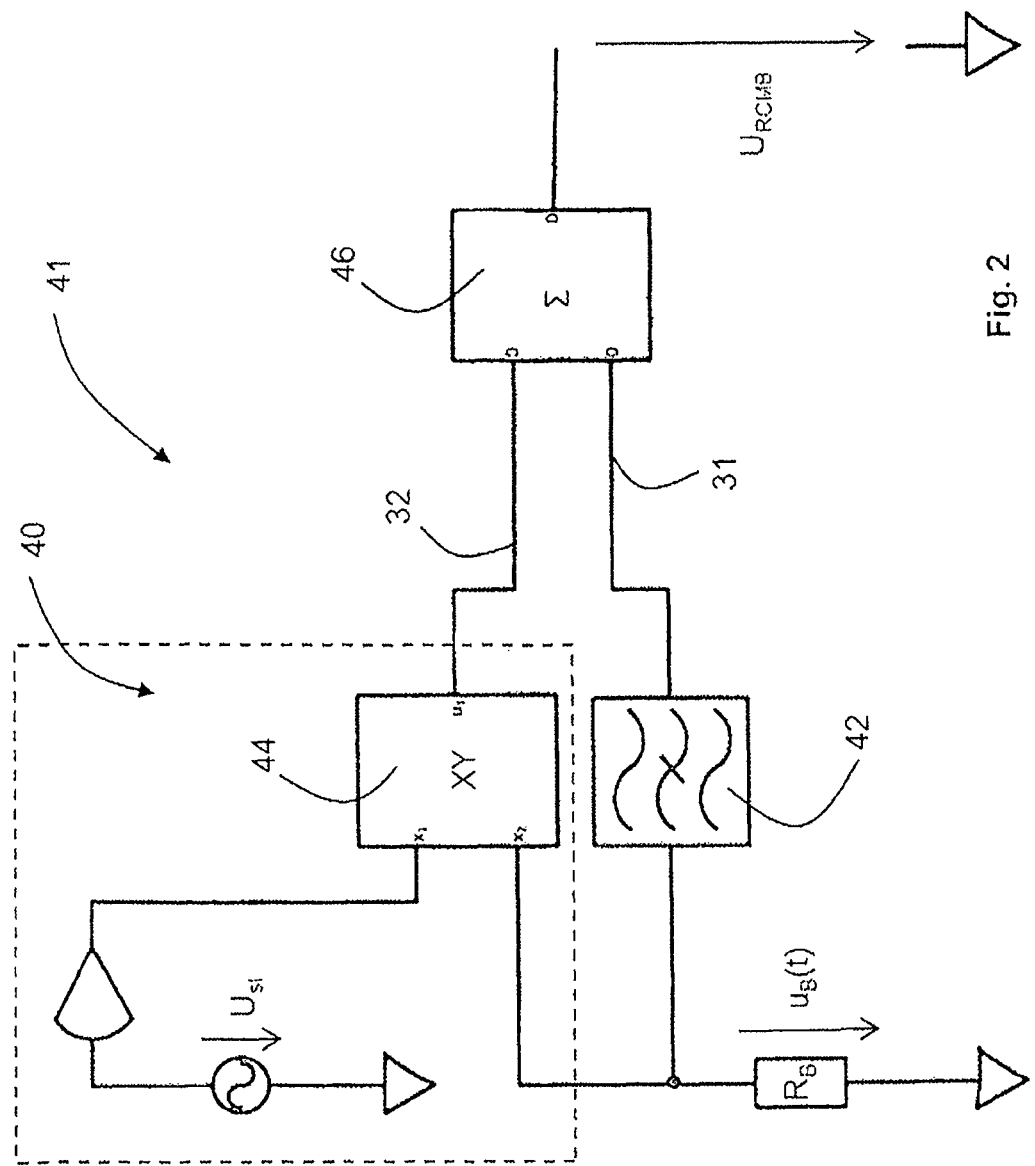
FIG. 2 shows a functional block diagram of signal processing.

FIG. 2 shows a functional block diagram of signal processing 41. The sum measuring signal $u_B(t)$, which can be tapped at the load resistance $R_B$, is supplied parallel in an assessment circuit 40 and a filter circuit 42. The assessment circuit 40 comprises a multiplier 44, which multiplies the sum measuring signal $u_B(t)$ and a control voltage $U_{st}$ sign-synchronous to the control current $i_{st}(t)$ with each other. As a result of this synchronous rectification, a measuring signal occurs on the multiplier output whose amplitude is directly proportional to the direct current flowing in the lead 10 (second measuring signal 32). The filter circuit 42 is realized as a band rejection filter 42 which suppresses the signal portions in the range of the frequency of the control current $i_{st}(t)$. Thus it is avoided that signal portions of the second measuring signal 32 additionally act on the first measuring signal 31 provided for registering alternating currents and might otherwise cause a distortion of the measured results. On the output of the band rejection filter 42, a first measuring signal 31 arises, which is proportional to the alternating current to be measured and which, added in an adder 46 to the second measuring signal 32, results in an output signal $U_{RCMB}$.

With the method according to the invention and the device implementing said method, an AC/DC sensitive current measurement is provided with a combination of a large bandwidth and a high measuring sensibility. The measurement can be applied for measuring the current of individual conductors as well as for measuring differential currents in current systems with multiple active conductors.

The invention claimed is:

1. A method for galvanically isolated, AC/DC sensitive current measurement, comprising a measuring current transformer (4) having a primary winding (10) through which a current to be measured is flowing, a transformer coupling between the primary winding (10) and a secondary winding (14) via a shared magnetic flux (12) which forms a magnetic circuit having at least one segment (28) made from a material of relative permeability, wherein in the secondary winding (14) a first partial voltage proportional to the change in time of the primary-side current is induced,
    characterized in that
    due to a change in time of the relative permeability in the material forming the segment (28), a second partial voltage is induced in the secondary winding (14) which is directly proportional to a direct current to be measured in the primary winding (10).

2. The method according to claim 1,
    characterized in that
    the change in time of the relative permeability in the material forming the segment (28) is effected by a control current transformer (6) which generates a magnetic control flux (26) in the material forming the segment (28), which is not coupled to the magnetic flux (12) of the measuring current transformer (4).

3. The method according to claim 2,
    characterized in that
    the magnetic control flux (26) is generated in the control current transformer (6) by means of a control winding (22) through which a temporally changeable control current ($i_{st}(t)$) with an adjustable frequency is flowing.

4. The method according to claim 3,
    characterized in that
    the temporally changeable control current ($i_{st}(t)$) in connection with a nonlinear magnetic characteristic curve causes a modulation-dependent change of the relative permeability in the material forming the segment (28) by changing the magnetic working point.

5. The method according to any of the claims 1 to 4,
    characterized in that
    at a load resistance ($R_B$) of the secondary winding (14) of the measuring current transformer (4), a sum measuring voltage ($u_B(t)$) can be registered due to the first and second induced partial voltages superimposing each other.

6. The method according to claim 5,
    characterized in that
    the registered sum measuring voltage ($u_B(t)$) is assessed synchronously to the temporally changeable control current ($i_{st}(t)$).

7. The method according to claim 6,
characterized in that
the assessment of the registered sum measuring voltage ($u_B(t)$) is effected by means of a voltage ($U_{st}$) which is synchronous to the temporally changeable control current ($i_{st}(t)$) and by which the sum measuring voltage ($u_B(t)$) registered at the load resistance ($R_B$) is multiplied, resulting in a second measuring signal (32) proportional to the direct current to be measured.

8. The method according to any of the claims 5 to 7,
characterized in that
a filtering of the registered sum measuring voltage ($u_B(t)$) is effected by means of a filter circuit, which is realized as a band rejection filter at the set frequency of the changeable control current ($i_{st}(t)$), resulting in a first measuring signal (31) proportional to the alternating current to be measured.

9. The method according to any of the claims 6 to 8,
characterized in that
the first measuring signal (31) and the second measuring signal (32) are added to obtain an output signal ($U_{RCMB}$) which displays the result of the AC/DC sensitive current measurement.

10. The method according to any of the claims 6 to 9,
characterized in that
for the improved registration of the first and the second measuring signal (31, 32), the frequency of the control current ($i_{st}(t)$) can be switched cyclically between at least two frequencies.

11. A device for galvanically isolated, AC/DC sensitive current measurement, comprising a measuring current transformer (4) having a primary winding (10) through which a current to be measured is flowing, a transformer coupling between the primary winding (10) and a secondary winding (14) via a shared magnetic flux (12) which forms a magnetic circuit having at least one segment (28) made from a material of relative permeability, wherein in the secondary winding (14) a first partial voltage proportional to the change in time of the primary-side current is induced,
characterized by
a control current transformer (6) having a temporally changeable magnetic control flux (26) which is not coupled to the magnetic flux (12) in the measuring current transformer (4) and forms a magnetic circuit in such a manner that the segment (28) of the magnetic circuit of the measuring current transformer (4) is formed as a shared segment (28) with the magnetic circuit of the control current transformer (6) so that the material forming the shared segment (28) is permeated by the control flux (26) and in connection with a nonlinear magnetic characteristic curve causes a change of the relative permeability in the material forming the segment (28) and thus a second induced partial voltage in the secondary winding (14).

12. The device according to claim 11,
characterized in that
for the decoupling of the magnetic flux (12) in the measuring current transformer (4) and of the magnetic flux (26) in the control current transformer (6), the measuring current transformer (4) and the control current transformer (6) are arranged in such a manner that the magnetic induction lines in the shared segment (28) of the two magnetic circuits run orthogonally to each other.

13. The device according to claim 11 or 12,
characterized in that
the connection between the measuring current transformer (4) and the control current transformer (6) in the shared segment (28) of the two magnetic circuits is formed with or without an air gap (9).

14. The device according to any of the claims 11 to 13,
characterized in that
the control current transformer (6) has a control winding (22) through which a temporally changeable control current ($i_{st}(t)$) with an adjustable frequency is flowing.

15. The device according to any of the claims 11 to 14,
characterized by
a signal processing means (41), which for registering a sum measuring voltage ($u_B(t)$) has a load resistance ($R_B$) in the secondary winding (14) of the measuring current transformer (4).

16. The device according to claim 15,
characterized in that
the signal processing means (41) has an assessment circuit (40) for assessing the registered sum measuring voltage ($u_B(T)$).

17. The device according to claim 15 or 16,
characterized in that
the assessment circuit (40) has a voltage source ($U_{st}$) controlled synchronously to the changeable control current ($i_{st}(t)$), whose output voltage is supplied to a multiplier (44) and multiplied by the registered sum measuring voltage ($u_B(t)$).

18. The device according to claim 16 or 17,
characterized in that
the signal processing means (41) has a filter circuit (42) to the input of which the registered sum measuring voltage ($u_B(t)$) is applied and which is formed as a band rejection filter (42) at the set frequency of the changeable control current ($i_{st}(t)$).

19. The device according to any of the claims 11 to 18,
characterized in that
the control current transformer (6) has a magnetic path length as short as possible.

* * * * *